US010348012B2

(12) United States Patent
Yamada et al.

(10) Patent No.: US 10,348,012 B2
(45) Date of Patent: Jul. 9, 2019

(54) SUBSTRATE-MOUNTED CONNECTOR FOR ELECTRONIC DEVICES AND MANUFACTURING METHOD THEREOF

(71) Applicant: KABUSHIKI KAISHA TOSHIBA, Minato-ku (JP)

(72) Inventors: Shukuyo Yamada, Yokohama (JP); Masaya Hirashima, Yokohama (JP); Tsuyoshi Kozai, Ome (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/822,363

(22) Filed: Nov. 27, 2017

(65) Prior Publication Data

US 2018/0366849 A1 Dec. 20, 2018

(30) Foreign Application Priority Data

Jun. 19, 2017 (JP) ................................ 2017-119818

(51) Int. Cl.

| | |
|---|---|
| ***H01R 12/00*** | (2006.01) |
| ***H05K 1/00*** | (2006.01) |
| ***H01R 12/70*** | (2011.01) |
| ***H01R 43/18*** | (2006.01) |
| ***H01R 43/20*** | (2006.01) |
| ***H01R 4/02*** | (2006.01) |
| *H01R 13/6585* | (2011.01) |
| *H01R 12/72* | (2011.01) |
| *H01R 13/405* | (2006.01) |
| *H01R 24/60* | (2011.01) |

(52) U.S. Cl.

CPC ........... *H01R 12/707* (2013.01); *H01R 4/028* (2013.01); *H01R 12/7064* (2013.01); *H01R 43/18* (2013.01); *H01R 43/20* (2013.01); *H01R 12/725* (2013.01); *H01R 13/405* (2013.01); *H01R 13/6585* (2013.01); *H01R 24/60* (2013.01)

(58) Field of Classification Search

CPC ........ H01R 4/028; H01R 9/091; H01R 12/57; H01R 12/7064; H01R 12/707; H01R 23/725; H01R 43/0235; H01R 43/0256; H01R 43/18; H01R 43/20; H05K 3/3426

USPC .................................................... 439/83, 866

See application file for complete search history.

(56) References Cited

U.S. PATENT DOCUMENTS 3,889,331 A * 6/1975 Grungras .............. B23B 27/007 407/110

4,217,024 A * 8/1980 Aldridge ................ H01R 4/028 439/381

(Continued)

FOREIGN PATENT DOCUMENTS

JP 2006-086029 3/2006

JP 2009-117104 5/2009

(Continued)

*Primary Examiner* — Hae Moon Hyeon

(74) *Attorney, Agent, or Firm* — Oblon, McClelland, Maier & Neustadt, L.L.P.

(57) ABSTRACT

According to one embodiment, a connector includes an insulator and a contact terminal in which an end side is pressed into a counter-press-fit portion of the insulator, and the other end side comprises a soldered portion attached to a substrate with soldering. The contact terminal comprises a flux accumulation portion inside the counter-press-fit portion and/or in an extended end portion of the soldered portion.

5 Claims, 11 Drawing Sheets

(56) References Cited

U.S. PATENT DOCUMENTS

| | | | | |
|---|---|---|---|---|
| 6,336,829 | B2 * | 1/2002 | Matsukawa ............ | H01R 12/57<br>439/636 |
| 9,088,111 | B2 * | 7/2015 | Lei ..................... | H01R 12/7088 |
| 9,142,932 | B2 | 9/2015 | Liaw et al. | |
| 2008/0220667 | A1 * | 9/2008 | Vigier ................. | H01M 2/0285<br>439/876 |
| 2010/0267257 | A1 | 10/2010 | Yeh et al. | |
| 2011/0034078 | A1 | 2/2011 | Nagata et al. | |
| 2011/0235293 | A1 | 9/2011 | Nagata et al. | |
| 2011/0237107 | A1 | 9/2011 | Nagata et al. | |
| 2011/0237127 | A1 | 9/2011 | Ohtsuji et al. | |
| 2012/0028502 | A1 | 2/2012 | Yeh et al. | |
| 2012/0100758 | A1 | 4/2012 | Liaw et al. | |
| 2014/0073150 | A1 * | 3/2014 | Lei ..................... | H01R 43/0256<br>439/78 |

FOREIGN PATENT DOCUMENTS

| | | |
|---|---|---|
| JP | 2011-040225 | 2/2011 |
| JP | 2011-243543 | 12/2011 |

* cited by examiner (a)

(b)

SUBSTRATE-MOUNTED CONNECTOR FOR ELECTRONIC DEVICES AND MANUFACTURING METHOD THEREOF

CROSS-REFERENCE TO RELATED APPLICATIONS

This application is based upon and claims the benefit of priority from Japanese Patent Application No. 2017-119818, filed Jun. 19, 2017, the entire contents of which are incorporated herein by reference.

FIELD

Embodiments described herein relate generally to a connector mounted on a substrate and a manufacturing method thereof.

BACKGROUND

For example, a receptacle-side connector (hereinafter, referred to as a receptacle) used for the connection of a universal serial bus (USB) comprises a shell which covers the external portion, an insulator formed of resin, and a contact terminal integrated with the insulator.

In a process for manufacturing the receptacle, the contact terminal is incorporated into the insulator by insert molding or a press fit method.

Insert molding is a method for inserting resin for molding the insulator around metal components including the contact terminal provided in a mold. This method is advantageous in that no space is created in the contact portion between the contact terminal and the insulator. However, the method is disadvantageous in that it is difficult to reduce the cost because of the increase in the number of steps for manufacturing the connector and the complicated process.

A press fit method is a method for pressing the contact terminal into the insulator. This method is advantageous in that the cost is reduced since the number of manufacturing steps is decreased in comparison with insert molding. However, the method is disadvantageous in that a space is created in the contact portion between the contact terminal and the insulator.

In line with the reduction in the size and thickness of electronic devices in recent years, the size and thickness of connectors have been reduced. Thus, for example, in the case of a thin and compact receptacle, the position at which a contact terminal is brought into direct contact with a substrate with soldering is very close to the position at which the contact terminal is inserted into an insulator. Therefore, in a process for manufacturing the thin and compact receptacle, the contact terminal is generally incorporated into the insulator by insert molding to prevent incursion of flux into the contact area.

However, as stated above, when the contact terminal is incorporated into the insulator by insert molding, it is difficult to reduce the cost of the manufacturing process.

When the contact terminal is incorporated into the insulator by a press fit method, in which the cost is reduced, a small space is created between the press-fit portion of the contact terminal pressed into the insulator and the counter-press-fit portion of the insulator. Through this space, the flux of the soldered portion of the contact terminal in direct contact with the substrate with soldering may intrude into and be attached to the contact area. The flux contains an insulating material. Thus, because of the flux attached to the contact area, the receptacle may have contact failure when a plug-side connector (hereinafter, referred to as a plug) is mounted.

Embodiments described herein aim to provide a connector capable of incorporating a contact terminal into an insulator by a press fit method by shaping the contact terminal and the insulator so as to prevent incursion of flux into the contact area, and a manufacturing method thereof.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

DETAILED DESCRIPTION

In general, according to one embodiment, a connector comprises an insulator and a contact terminal in which an end side is pressed into a counter-press-fit portion of the insulator, and the other end side comprises a soldered portion attached to a substrate with soldering. The contact terminal comprises a flux accumulation portion inside the counter-press-fit portion and/or in an extended end portion of the soldered portion.

Various embodiments will be described hereinafter with reference to the accompanying drawings.

Figure 1A:
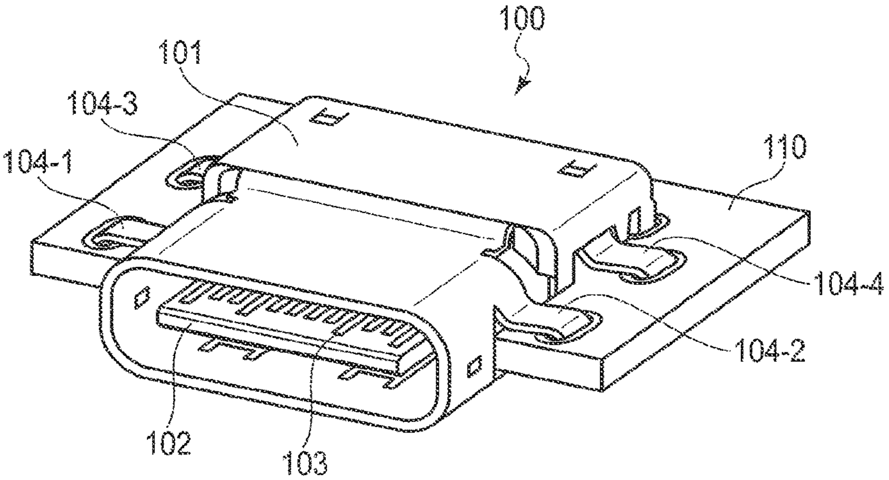
FIG. 1A is an external appearance perspective view showing an example of a receptacle according to an embodiment.

FIG. 1A is an external appearance perspective view showing an example of a receptacle 100 according to an embodiment. The receptacle 100 comprises a shell 101 which covers the external portion, an insulator 102 formed of resin, and a contact terminal 103 integrated with the insulator 102. The shell 101 is formed of a metal material and is cylindrical. The insulator 102 is provided inside the shell 101 and holds the integrated contact terminal 103. The area of an end of the contact terminal 103 is a contact area for the electrical connection to a plug inserted from outside. The area of the other end of the contact terminal 103 is electrically connected to a substrate 110 with soldering.

The receptacle 100 of FIG. 1A is an offset connector provided in the portions formed by partially cutting the substrate 110. The shell 101 comprises supporting leg portions 104-1, 104-2, 104-3 and 104-4 attached to the substrate 110 with soldering, and is secured to the substrate 110 by supporting leg portions 104-1, 104-2, 104-3 and 104-4.

Figure 1B:
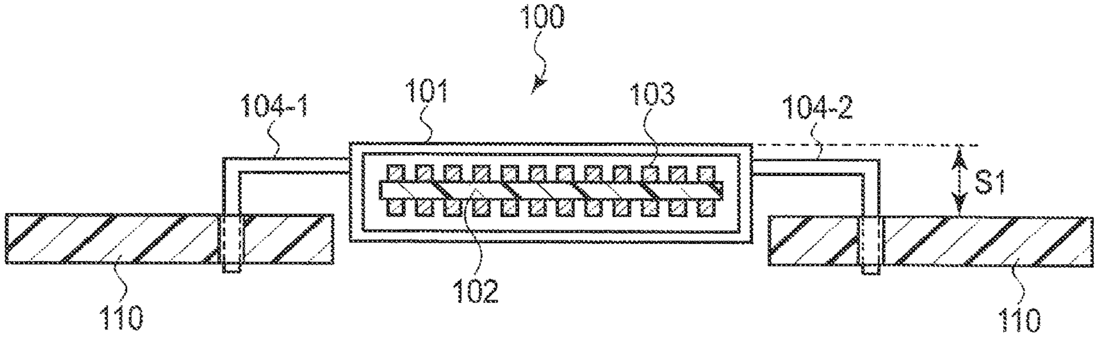
FIG. 1B is an example of a front view of the receptacle shown in FIG. 1A from the insertion direction of a plug fitted in the receptacle.

FIG. 1B is an example of a front view of the receptacle 100 shown in FIG. 1A from the insertion direction of a plug fitted in the receptacle 100. Since the receptacle 100 is an offset receptacle provided in the cut portions of the substrate 110, the thickness S1 between the surface of the substrate 110 and the highest surface of the receptacle 100 can be reduced in comparison with an onboard receptacle, which is provided on a substrate.

Figure 1C:
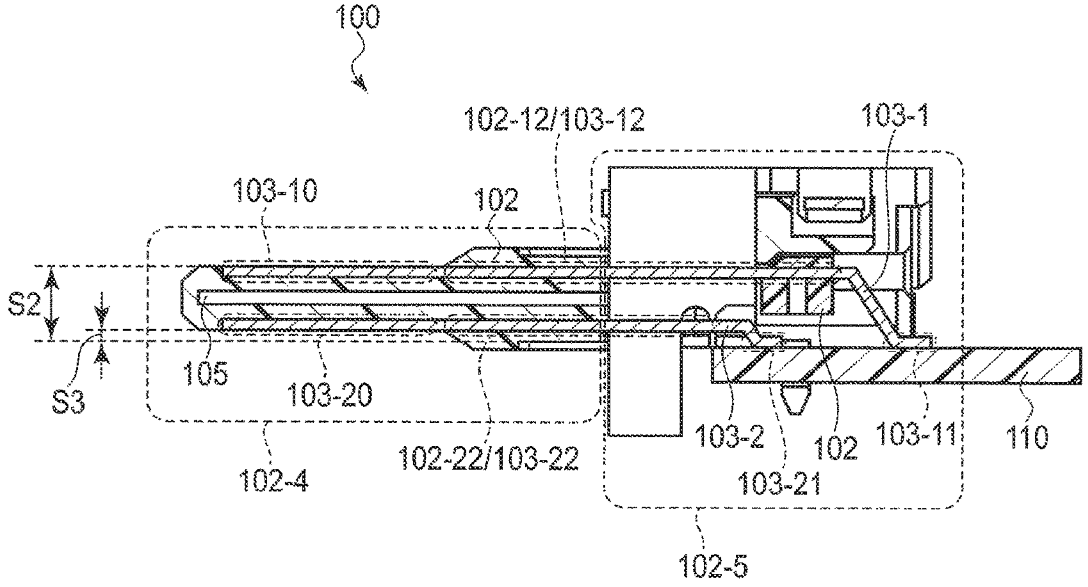
FIG. 1C is an example of a sectional side view of the receptacle shown in FIG. 1A relative to the insertion direction of a plug fitted in the receptacle.

FIG. 1C is an example of a sectional side view of the receptacle 100 shown in FIG. 1A relative to the insertion direction of a plug fitted in the receptacle 100.

The insulator 102 comprises a rear basal portion 102-5 and a lingulate portion 102-4 protruding from the rear basal portion 102-5. The contact terminal comprises an upper contact terminal 103-1 and a lower contact terminal 103-2.

An end of the upper contact terminal 103-1 extends on the upper surface of the lingulate portion 102-4 of the insulator 102 for the electrical connection to a plug fitted in the receptacle, and forms a contact area 103-10. The other end of the upper contact terminal 103-1 is attached to the substrate 110 in a soldered portion 103-11 with soldering. The upper contact terminal 103-1 forms a press-fit portion 103-12 between contact area 103-10 and soldered portion 103-11. Press-fit portion 103-12 is inserted into the portion in which the lingulate portion 102-4 of the insulator 102 is connected to the rear basal portion 102-5 and the rear basal portion 102-5.

Similarly, an end of the lower contact terminal 103-2 extends on the lower surface of the lingulate portion 102-4 of the insulator for the electrical connection to a plug fitted in the receptacle, and forms a contact area 103-20. The other end of the lower contact terminal 103-2 is attached to the substrate 110 in a soldered portion 103-21 with soldering. The lower contact terminal 103-2 forms a press-fit portion 103-22 between contact area 103-20 and soldered portion 103-21. Press-fit portion 103-22 is inserted into the portion in which the lingulate portion 102-4 of the insulator 102 is connected to the rear basal portion 102-5 and the rear basal portion 102-5.

A metal plate 105 for grounding or shielding is inserted into the middle portion of the thickness of the lingulate portion 102-4 of the insulator. The metal plate 105 is connected to the ground wire of the substrate 110.

The rear basal portion 102-5 of the insulator 102 forms a counter-press-fit portion 102-12 into which the upper contact terminal 103-1 is inserted, and a counter-press-fit portion 102-22 into which the lower contact terminal 103-2 is inserted.

The upper contact terminal 103-1 and the lower contact terminal 103-2 are incorporated into the insulator 102 by a press fit method. Thus, a space is created between press-fit portion 103-12 of the upper contact terminal 103-1 and counter-press-fit portion 102-12 of the insulator 102. Further, a space is created between press-fit portion 103-22 of the lower contact terminal 103-2 and counter-press-fit portion 102-22 of the insulator 102.

As stated above, the receptacle 100 is an offset connector provided in the portions formed by partially cutting the substrate 110. Thus, contact area 103-10 viewed from soldered portion 103-11 of the upper contact terminal 103-1 and contact area 103-20 viewed from soldered portion 103-21 of the lower contact terminal 103-2 are low. In some cases, the contact areas are lower than the soldered portions.

Thus, the flux of soldered portion 103-11 easily intrudes into contact area 103-10 through the space between press-fit portion 103-12 of the upper contact terminal 103-1 and counter-press-fit portion 102-12 of the insulator 102. Similarly, the flux of soldered portion 103-21 easily intrudes into contact area 103-20 through the space between press-fit portion 103-22 of the lower contact terminal 103-2 and counter-press-fit portion 102-22 of the insulator 102. In some cases, the flux of the portion in which supporting leg portions 104-1, 104-2, 104-3 and 104-4 of the shell 101 are attached to the substrate 110 with soldering intrudes into contact areas 103-10 and 103-20 through the internal side of the shell 101.

First Embodiment

In a first embodiment, a receptacle comprises a cavity 230 in the counter-press-fit portions of an insulator 202. Thus, the receptacle forms a flux accumulation portion for accumulating the flux intruding through the spaces between the press-fit portions and the counter-press-fit portions.

Figure 2A:
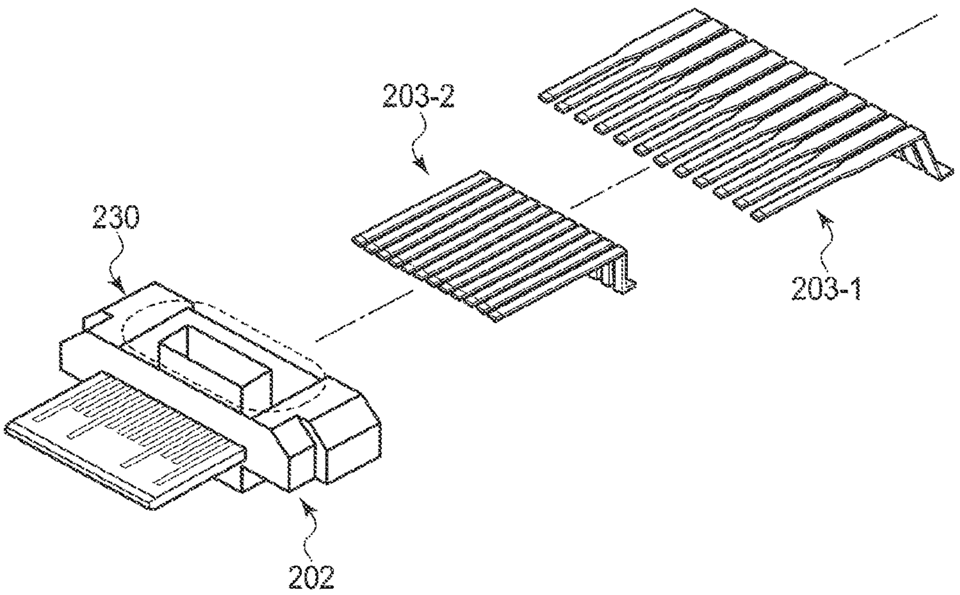
FIG. 2A is an external appearance perspective view showing an example of a flux accumulation portion provided inside an insulator provided in a receptacle according to a first embodiment.

FIG. 2A is an external appearance perspective view showing an example of the flux accumulation portion provided inside the insulator of the receptacle according to the first embodiment.

An upper contact terminal 203-1 and a lower contact terminal 203-2 are pressed into the insulator 202. The insulator 202 comprises the cavity 230 for accumulating flux inside the insulator 202.

Figure 2B:
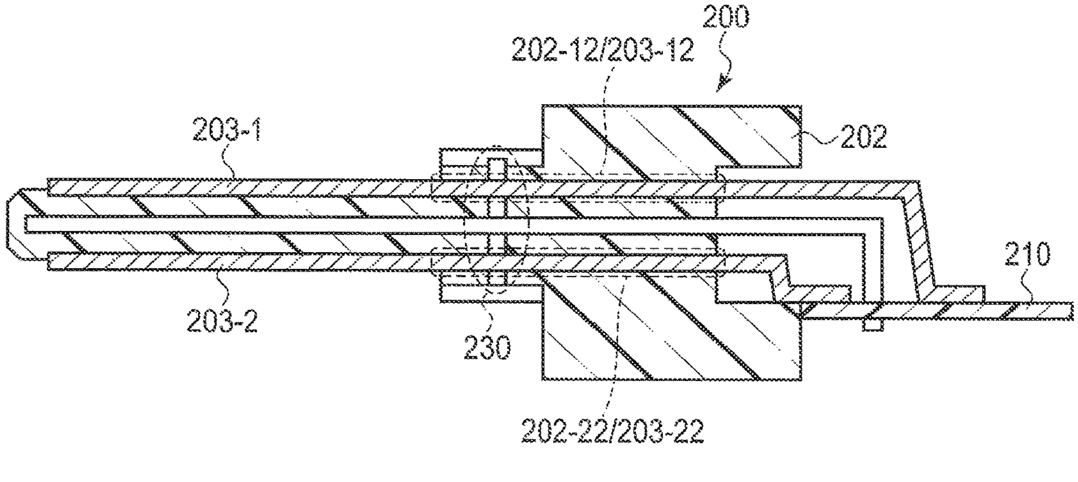
FIG. 2B is an example of a sectional side view of the receptacle shown in FIG. 2A relative to the insertion direction of a plug fitted in the receptacle.

FIG. 2B is a sectional side view of the example of the receptacle 200 shown in FIG. 2A relative to the insertion direction of a plug fitted in the receptacle 200. The cavity 230 for accumulating flux is provided so as to include a part of a counter-press-fit portion 202-12 of the insulator 202 into which the upper contact terminal 203-1 is inserted and a part of a counter-press-fit portion 202-22 of the insulator 202 into which the lower contact terminal 203-2 is inserted.

Figure 2C:
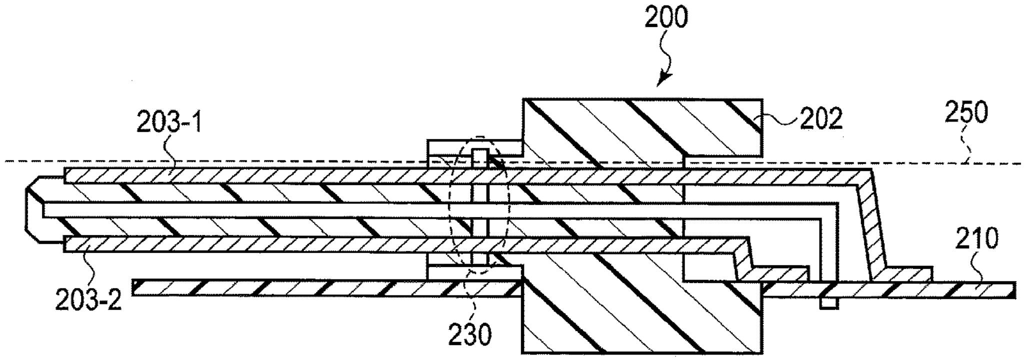
FIG. 2C is an example of the horizontal section of the receptacle shown in FIG. 2A as viewed from above relative to the insertion direction of a plug fitted in the receptacle.
Figure 2C:
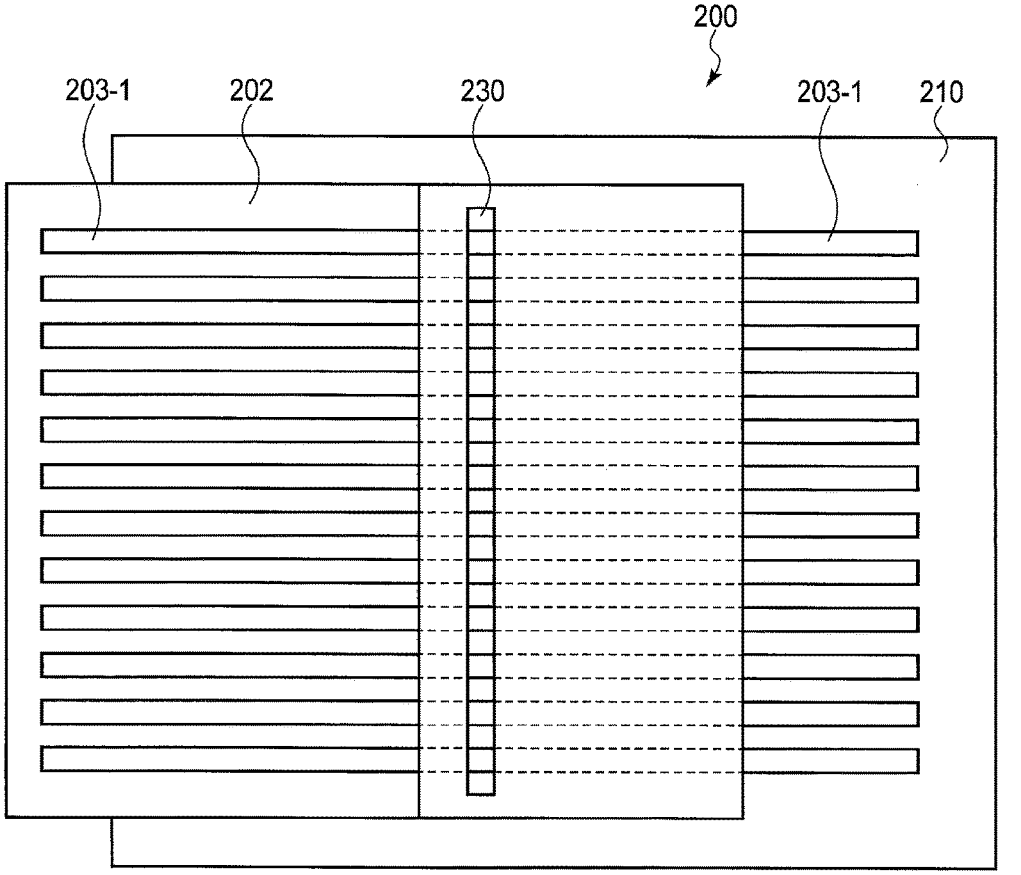

FIG. 2C(a) is a sectional side view of the same receptacle 200 as FIG. 2B. FIG. 20(*b*) is a cross-sectional view in which the receptacle 200 is viewed from above based on a cross-sectional surface taken along line 250 of FIG. 2C(a) and parallel to a substrate 210. In the example of the cross-sectional view, the single cavity 230 is provided such that the press-fit portions of all the contact terminals are partially exposed in (or partially communicate with) the cavity.

Figure 2D:
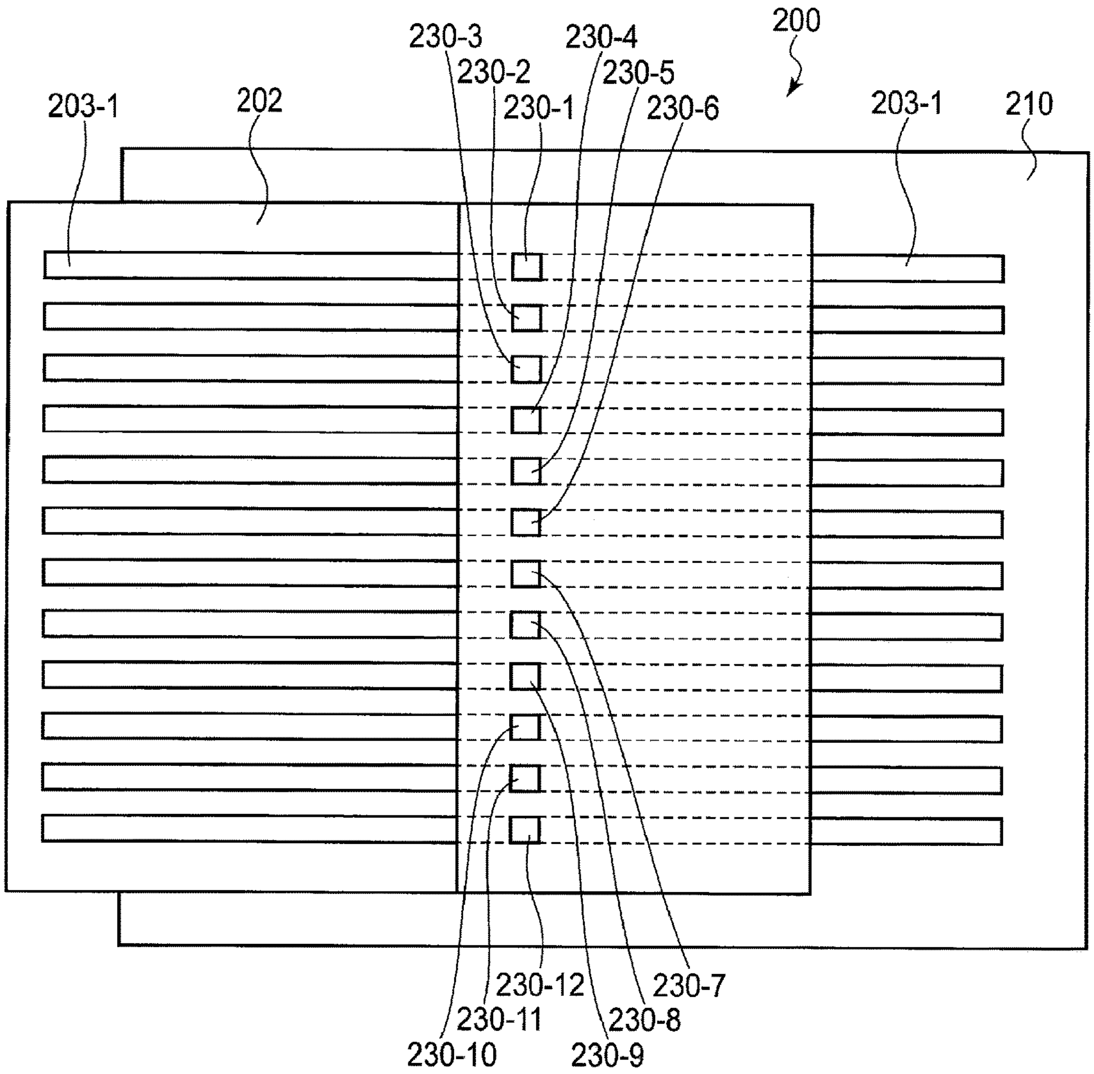
FIG. 2D is another example of the horizontal section of the example of the receptacle shown in FIG. 2A as viewed from above relative to the insertion direction of a plug fitted in the receptacle.

FIG. 2D is a cross-sectional view in which the receptacle 200 is viewed from above based on a cross-sectional surface taken along line 250 of FIG. 2C(a) and parallel to the substrate 210 in a manner similar to that of FIG. 2C(b). In the example of the cross-sectional view, a plurality of independent cavities 230-1 to 230-12 are provided such that a part of each press-fit portion of the contact terminals is exposed in (or communicates with) a corresponding independent cavity.

The size of the cavity 230 formed in the insulator 202 can be arbitrarily determined in accordance with the shape of the entire connector, the amount of soldering of the soldered portions and the amount of flux.

The cavity 230 may be formed by insert molding when the insulator is formed. The cavity 230 may be formed by machining or laser processing after the formation of the insulator.

As described above, the receptacle of the first embodiment comprises the cavity 230 inside the insulator 202 so as to partially include counter-press-fit portions 202-12 and 202-22 of the insulator 202. In this structure, even if flux intrudes into the space between a press-fit portion 203-12 of the upper contact terminal 203-1 and counter-press-fit portion 202-12 of the insulator 202 or the space between a press-fit portion 203-22 of the lower contact terminal 203-2 and counter-press-fit portion 202-22 of the insulator 202, the flux can be accumulated in the cavity 230 provided inside the insulator 202. In this manner, the flux flowing from the soldered portions of a contact terminal 203 does not intrude into or is not attached to the contact areas of the contact terminal. Thus, it is possible to prevent the contact failure between the connector and the receptacle 200 caused when flux is attached to the contact areas.

Even if the cavity 230 is formed in the insulator 202, the cost of the manufacturing process is not dramatically increased. Thus, it is possible to incorporate a contact terminal into an insulator by a press fit method in a process for manufacturing a thin and compact connector. In this way, the increase in the cost can be prevented.

Second Embodiment

According to a second embodiment, a receptacle forms flux accumulation portions by bending the extended end portions of soldered portions of contact terminals.

Figure 3A:
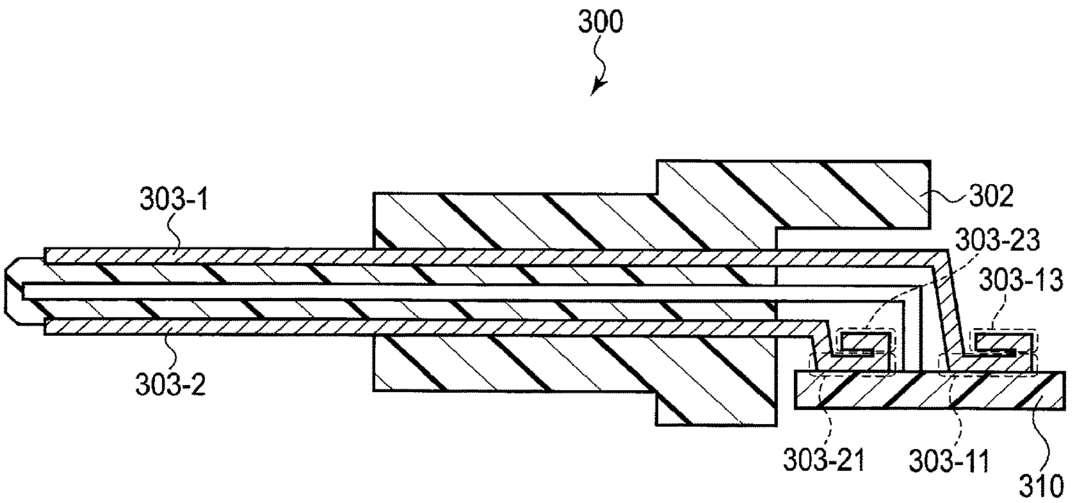
FIG. 3A is a sectional side view of an example of a receptacle relative to the insertion direction of a plug fitted in the receptacle according to a second embodiment.

FIG. 3A is a sectional side view of an example of a receptacle 300 relative to the insertion direction of a plug-side connector fitted in the receptacle 300 according to the second embodiment.

An upper contact terminal 303-1 forms a flux accumulation portion by bending the extended end portion of a soldered portion 303-11 which is in direct contact with a substrate 310. Similarly, a lower contact terminal 303-2 forms a flux accumulation portion by bending the extended end portion of a soldered portion 303-21 which is in direct contact with the substrate 310.

Figure 3B:
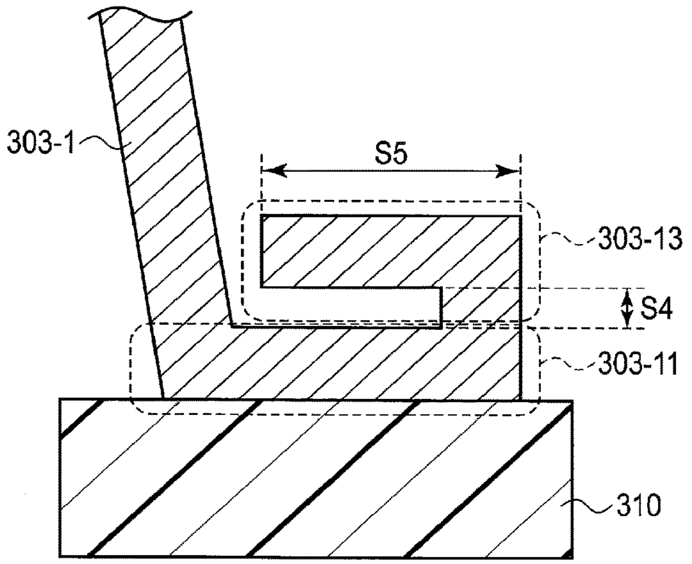
FIG. 3B shows an example of a bend portion provided in the upper contact terminal shown in FIG. 3A.

FIG. 3B is an enlarged view of soldered portion 303-11 which is in direct contact with the substrate 310 and a bend portion 303-13 which is the extended end portion of the soldered portion in the upper contact terminal 303-1. Bend portion 303-13 is formed by bending soldered portion 303-11 in a direction moving away from the substrate 310 (upward from the substrate), assuring a certain distance S4 and further bending the extended soldered portion 303-11 in a direction parallel to the substrate 310. The upper contact terminal 303-1 forms a flux accumulation portion between soldered portion 303-11 which is in direct contact with the substrate 310 and bend portion 303-13 by having distance S4.

Figure 3C:
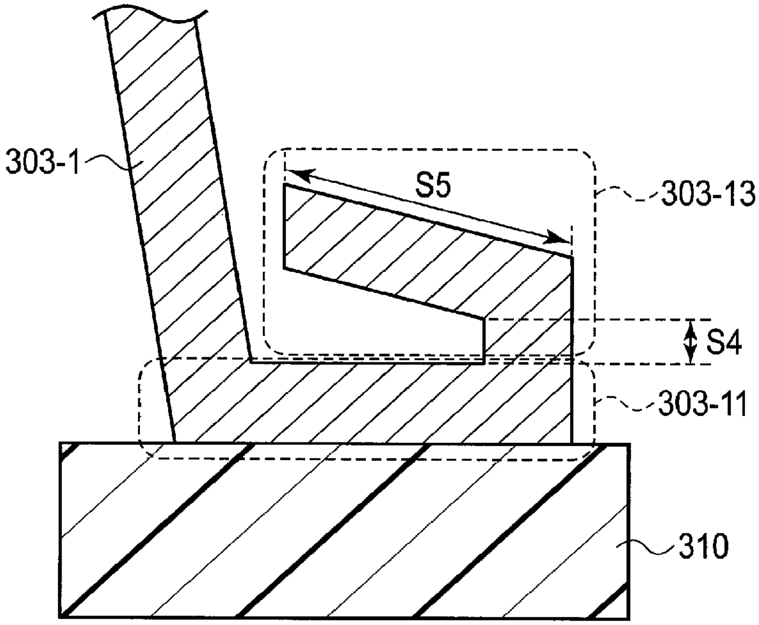
FIG. 3C shows another example of the shape of the bend portion of the upper contact terminal.
Figure 3D:
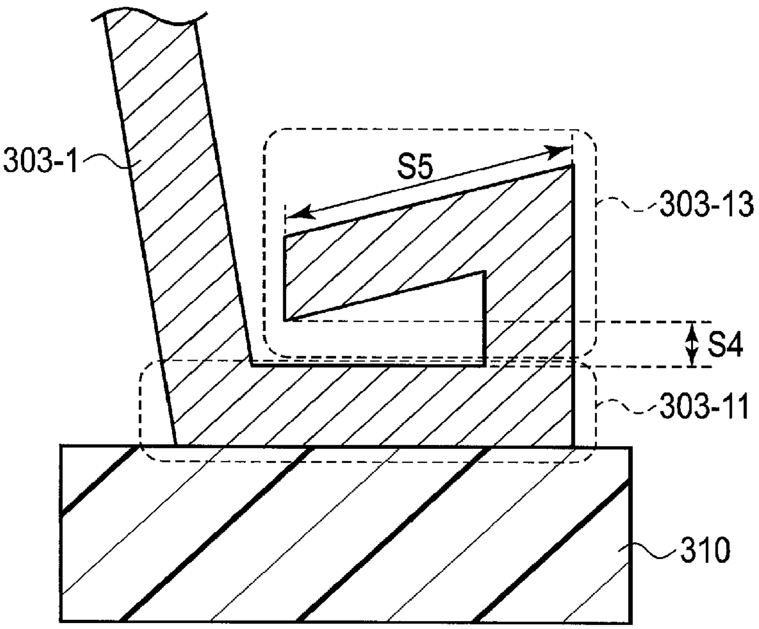
FIG. 3D shows another example of the bend portion of the upper contact terminal.
Figure 3E:
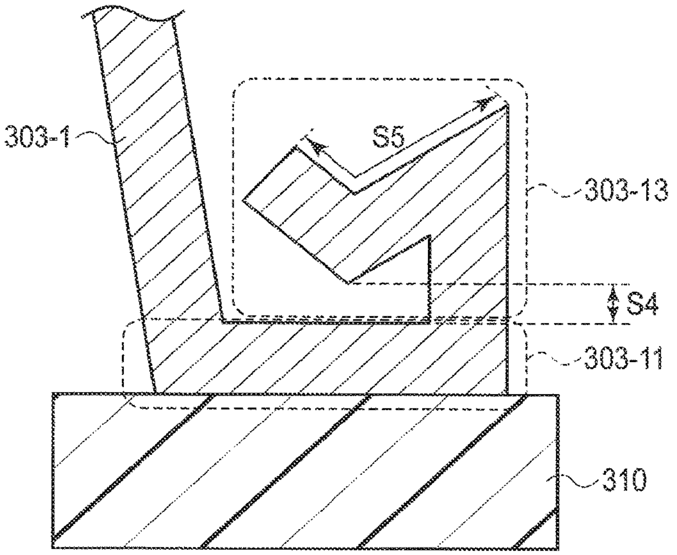
FIG. 3E shows another example of the bend portion of the upper contact terminal.

FIG. 3C, FIG. 3D and FIG. 3E show other examples of the shape of the bend portion of the upper contact terminal 303-1. As shown in FIGS. 3C, 3D and 3E, soldered portion 303-11 which is in direct contact with the substrate 310 is not necessarily parallel to bend portion 303-13. For example, the minimum distance between soldered portion 303-11 and bend portion 303-13 should be S4. Bend portion 303-13 may be curved. The direction, shape and size of bend portion 303-13 can be arbitrarily determined in accordance with the shape of the entire connector, the amount of soldering of soldered portion 303-11 and the amount of flux. Length S5 of bend portion 303-13 can be also arbitrarily determined in accordance with the shape and size of the entire connector, the amount of soldering of soldered portion 303-11 and the amount of flux.

Similarly, a lower contact terminal 303-2 comprises soldered portion 303-21 which is in direct contact with the substrate 310 and a bend portion (not shown) which is the extended end portion of the soldered portion.

The shape or size of the bend portion of the upper contact terminal 303-1 may be the same as or different from the shape or size of the bend portion of the lower contact terminal 303-2.

The receptacle of the second embodiment may lengthen the path from the soldered portions to the press-fit portions by bending the areas from the soldered portions of a contact terminal 103 to the press-fit portions.

Figure 3F:
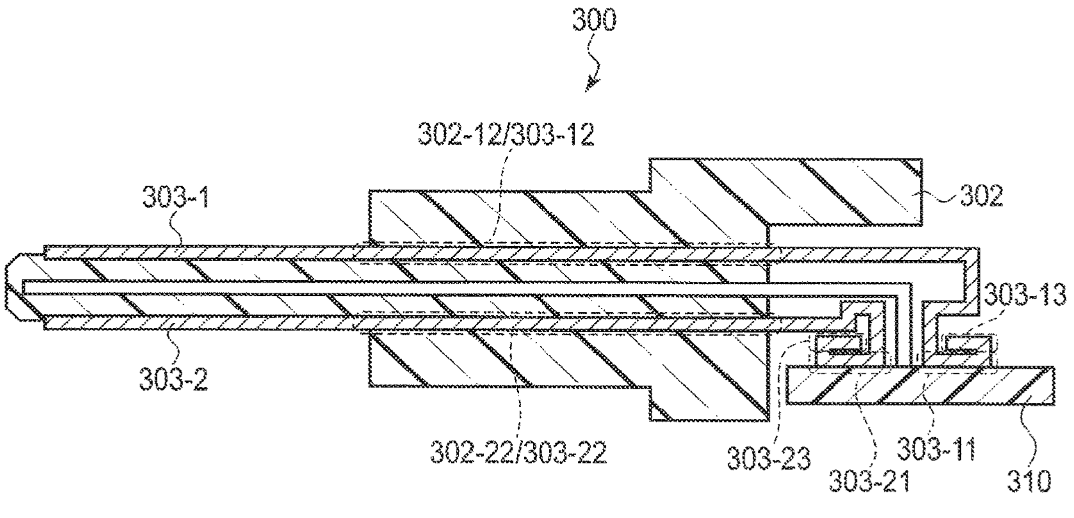
FIG. 3F shows an example of bending when the receptacle shown in FIG. 3A is further bended between a soldered portion and a press-fit portion in each contact terminal.

FIG. 3F shows an example of bending when the receptacle shown in FIG. 3A is further bended between soldered portion 303-11 and a press-fit portion 303-12 in the upper contact terminal 303-1 and between soldered portion 303-21 and a press-fit portion 303-22 in the lower contact terminal 303-2.

Figure 3G:
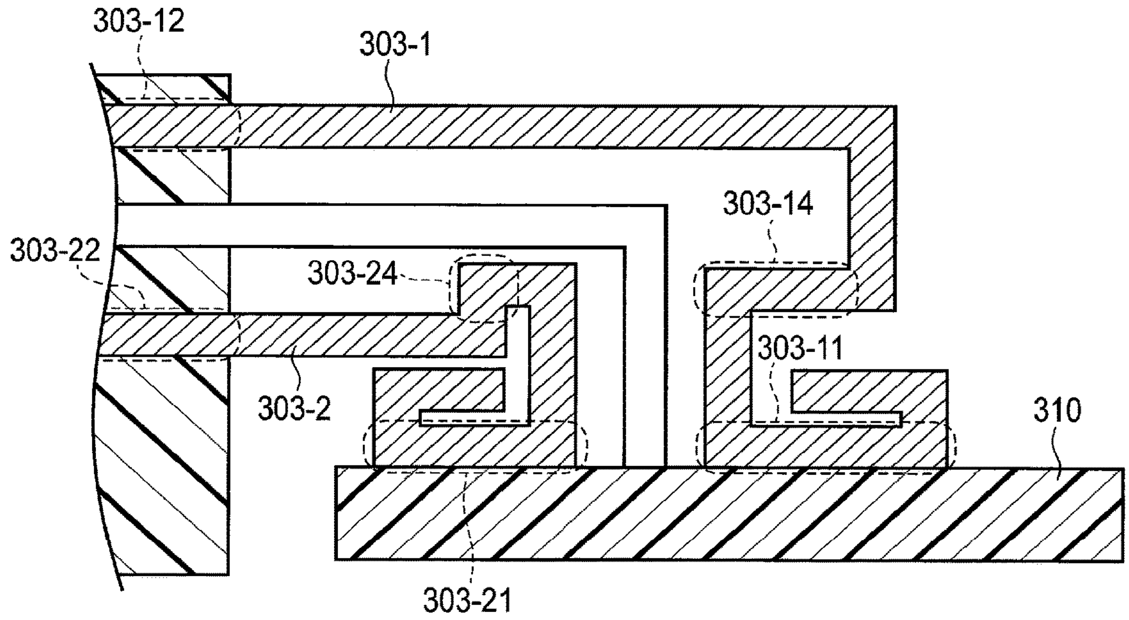
FIG. 3G is an enlarged view of the bended portions between soldered portion 303-11 and press-fit portion 303-12 in the upper contact terminal 303-1 shown in FIG. 3F and between soldered portion 303-21 and press-fit portion 303-22 in the lower contact terminal 303-2.

FIG. 3G is an enlarged view of the bended portions between soldered portion 303-11 and press-fit portion 303-12 in the upper contact terminal 303-1 shown in FIG. 3F and between soldered portion 303-21 and press-fit portion 303-22 in the lower contact terminal 303-2.

The upper contact terminal 303-1 comprises a portion formed by bending the upper contact terminal 303-1 in a direction moving away from press-fit portion 303-12 in the area starting from soldered portion 303-11 to press-fit portion 303-12. The portion formed by bending the upper contact terminal 303-1 in a direction moving away from press-fit portion 303-12 is, for example, portion 303-14 of the upper contact terminal 303-1.

Similarly, the lower contact terminal 303-2 comprises a portion formed by bending the lower contact terminal 303-2 in a direction moving away from press-fit portion 303-22 in the area starting from soldered portion 303-21 to press-fit portion 303-22. The portion formed by bending the lower contact terminal 303-2 in a direction moving away from press-fit portion 303-22 is, for example, portion 303-24 of the lower contact terminal 303-2. The bending shape may be arbitrarily determined.

As described above, the receptacle of the second embodiment can form flux accumulation portions by bending the extended end portions of the soldered portions of the contact terminals. In this structure, the receptacle of the second embodiment can prevent the incursion of flux from the soldered portions of the contact terminals by accumulating flux in the flux accumulation portions. Further, the receptacle of the second embodiment can lengthen the path from the soldered portions of the contact terminals to the press-fit portions by bending the contact terminals in a direction moving away from the press-fit portions in the areas starting from the soldered portions of the contact terminals to the press-fit portions. In this structure, even if flux flows from the soldered portions of the contact terminals, the flux hardly reaches the press-fit portions. As a result, in the receptacle of the second embodiment, flux does not intrude into or is not attached to the contact areas of the contact terminals. Thus, it is possible to prevent the contact failure between the connecter and the receptacle 300 caused by the attachment of flux to the contact areas.

Even if the extended end portions of the soldered portions of the contact terminals are bended, and the portions between the soldered portions of the contact terminals and the press-fit portions are bended, the manufacturing cost is not increased. Thus, it is possible to incorporate a contact terminal into an insulator by a press fit method in a process for manufacturing a thin and compact connector. In this way, the increase in the cost can be prevented.

In the above explanation, an offset receptacle is used. However, even if an onboard receptacle is used, the first and second embodiments can be realized in a similar manner.

Figure 4:
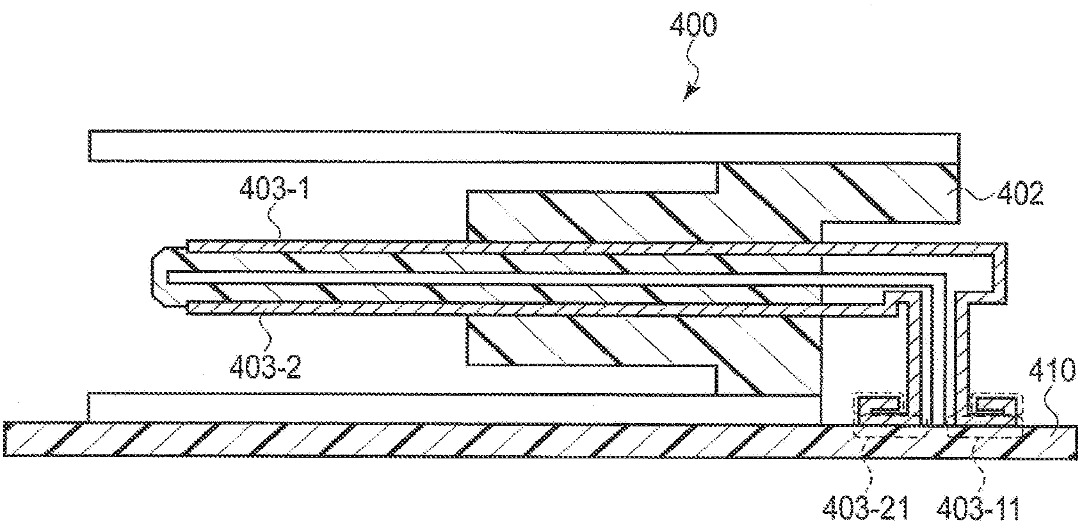
FIG. 4 is a sectional side view of an example of an onboard receptacle relative to the insertion direction of a plug fitted in the receptacle according to the second embodiment.

FIG. 4 is a sectional side view of an example of an onboard receptacle 400 relative to the insertion direction of a plug fitted in the receptacle 400 according to the second embodiment. The onboard receptacle 400 is different from the offset receptacle in respect that the entire receptacle 400 is mounted on a substrate 410.

A receptacle may be realized by combining the first and second embodiments.

Figure 5:
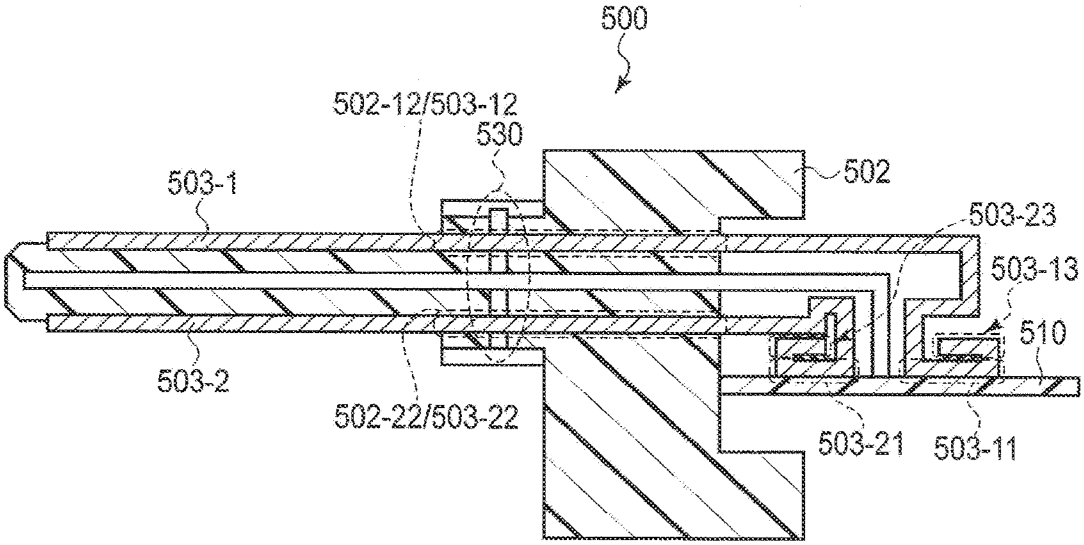
FIG. 5 is a sectional side view of an example of a receptacle realized by combining the first and second embodiments relative to the insertion direction of a plug fitted in the receptacle.

FIG. 5 is a sectional side view of an example of a receptacle 500 realized by combining the first and second embodiments relative to the insertion direction of a plug fitted in the receptacle 500. An insulator 502 comprises a cavity 530 so as to include a part of counter-press-fit portion 502-12 into which an upper contact terminal 503-1 is inserted and a part of a counter-press-fit portion 502-22 into which a lower contact terminal 503-2 is inserted.

The upper contact terminal 503-1 forms a flux accumulation portion by bending a soldered portion 503-11 and its extended end portion 503-13. Similarly, the lower contact terminal 503-2 forms a flux accumulation portion by bending a soldered portion 503-21 and its extended end portion 503-23.

Further, the upper contact terminal 503-1 comprises a portion formed by bending the upper contact terminal 503-1 in a direction moving away from a press-fit portion 503-12 in the area starting from soldered portion 503-11 to press-fit portion 503-12. Similarly, the lower contact terminal 503-2 comprises a portion formed by bending the lower contact terminal 503-2 in a direction moving away from a press-fit portion 503-22 in the area starting from soldered portion 503-21 to press-fit portion 503-22.

The insulator of a conventional receptacle does not comprise a cavity for accumulating flux inside the insulator in a manner different from that of the insulator shown in the first embodiment. Each contact terminal of a conventional receptacle does not comprise the extended end portion of a soldered portion in a manner different from that of the contact terminals shown in the second embodiment. Further, each contact terminal of a conventional receptacle does not comprise a portion formed by bending the contact terminal in a direction moving away from a press-fit portion 603-22 in the area starting from a soldered portion 603-21 to press-fit portion 603-22 in a manner different from the contact terminals shown in the second embodiment.

Figure 6:
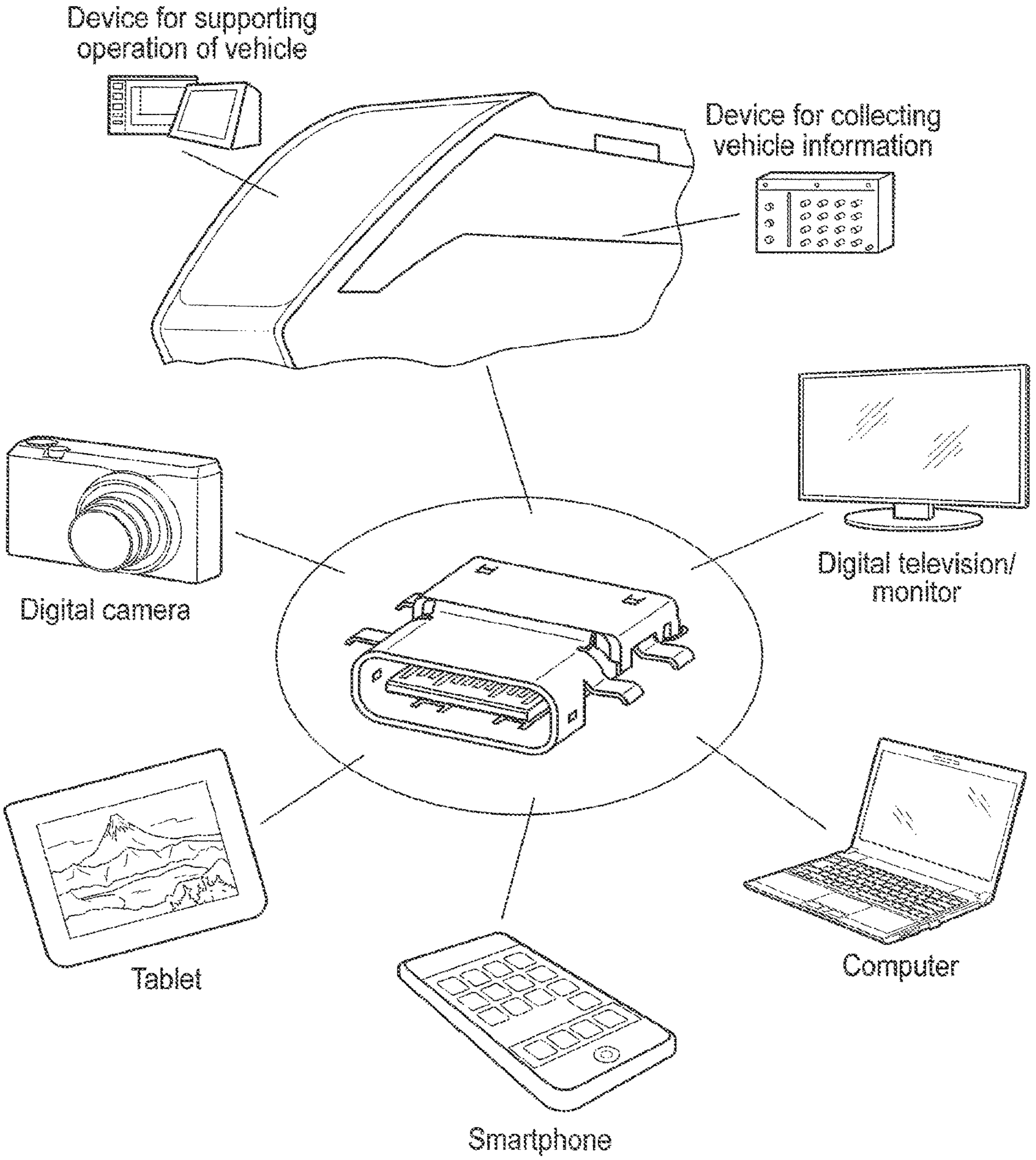
FIG. 6 shows application examples of a receptacle according to an embodiment.

FIG. 6 shows electronic devices according to the embodiments of the present invention, such as a computer, a smartphone, a tablet, a digital camera, a digital television/monitor, a device for supporting the operation of railway and a device for collecting vehicle information. Each of these electronic devices comprises the receptacle-side connector of an embodiment of the present invention for the connection to an external device. When an embodiment of the present invention is applied to these electronic devices, the contact failure caused by the insertion of a plug-side connector can be reduced or improved. Thus, the reliability of connectors can be dramatically improved.

The present invention may be implemented in the following embodiment.

According to the embodiment, a receptacle-side connector comprises:

an insulator; and a contact terminal in which an end side is pressed into a counter-press-fit portion of the insulator, and the other end side comprises a soldered portion attached to a substrate with soldering, wherein the contact terminal forms a flux accumulation portion by the soldered portion and an extended end portion which is upright in a direction moving away from the substrate with a certain distance and is bended.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. The embodiments of the present invention cover a case where the structural elements of each claim are separately expressed, a case where some of the structural elements of the claims are combined with each other, and a combination of these cases. Even if a claim is recited as control logic, a program including instructions for causing a computer to execute functions, or a computer-readable recording medium in which the instructions are described, all the cases are regarded as the application of the devices of the present embodiments. Even expressions other than the used names or terms are included in the scope of the present invention as long as they indicate substantially the same matters.

What is claimed is:

1. A connector comprising:

an insulator comprising a cavity inside; and a contact terminal in which an end side comprises a contact area for electrical connection to a fitted plug, and the other end side comprises a soldered portion attached to a substrate with soldering, at least a part between the contact area and the soldered portion being pressed into a counter-press-fit portion of the insulator, wherein the insulator forms the counter-press-fit portion so as to insert the contact terminal into the cavity, and the contact terminal comprises a flux accumulation portion inside the cavity and/or in an extended end portion of the soldered portion.

2. The connector of claim 1, further comprising:

a plurality of counter-press-fit portions each identical to the counter-press-fit portion; and a plurality of contact terminals each identical to the contact terminal, wherein the contact terminals are inserted into the counter-press-fit portions, respectively, and the cavity is a single cavity in which the contact terminals are partially exposed.

3. The connector of claim 1, further comprising:

a plurality of counter-press-fit portions each identical to the counter-press-fit portion; and a plurality of contact terminals each identical to the contact terminal, wherein the contact terminals are inserted into the counter-press-fit portions, respectively, and the cavity includes a plurality of cavities, and a part of each of the contact terminals is independently exposed in a corresponding cavity of the plurality of cavities.

4. The connector of claim 1, wherein the extended end portion is upright in a direction moving away from the substrate with a certain distance with respect to the soldered portion and is bent, and this bent portion is the flux accumulation portion.

5. The connector of claim 1, wherein the contact terminal is bent in a direction moving away from a press-fit portion pressed into the counter-press-fit portion of the insulator in an area starting from the soldered portion to the counter-press-fit portion.

* * * * *